(12) United States Patent
Fulford et al.

(10) Patent No.: US 11,894,378 B2
(45) Date of Patent: Feb. 6, 2024

(54) MULTIPLE NANO LAYER TRANSISTOR LAYERS WITH DIFFERENT TRANSISTOR ARCHITECTURES FOR IMPROVED CIRCUIT LAYOUT AND PERFORMANCE

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/727,249

(22) Filed: Apr. 22, 2022

(65) Prior Publication Data

US 2022/0246612 A1    Aug. 4, 2022

Related U.S. Application Data

(62) Division of application No. 16/591,134, filed on Oct. 2, 2019, now Pat. No. 11,362,091.

(60) Provisional application No. 62/866,975, filed on Jun. 26, 2019.

(51) Int. Cl.
| | |
|---|---|
| H01L 27/092 | (2006.01) |
| H01L 27/088 | (2006.01) |
| H01L 21/822 | (2006.01) |
| H01L 21/8238 | (2006.01) |

(52) U.S. Cl.
CPC ...... *H01L 27/0924* (2013.01); *H01L 21/8221* (2013.01); *H01L 21/823814* (2013.01); *H01L 21/823821* (2013.01); *H01L 27/0886* (2013.01)

(58) Field of Classification Search
CPC . H01L 27/092; H01L 27/088; H01L 27/0886; H01L 27/0924; H01L 27/0688; H01L 21/823821; H01L 21/823814; H01L 21/823425; H01L 21/8221; H01L 29/42392; H01L 29/78696
See application file for complete search history.

(56) References Cited

U.S. PATENT DOCUMENTS

| | | |
|---|---|---|
| 9,406,697 B1 | 8/2016 | Liu et al. |
| 9,583,490 B2 | 2/2017 | Peng |
| 9,646,994 B2 | 5/2017 | Liu et al. |
| 9,647,098 B2 | 5/2017 | Obradovic et al. |
| 9,905,477 B2 | 2/2018 | Peng |
| 10,192,867 B1 | 1/2019 | Frougier et al. |
| 10,236,292 B1 | 3/2019 | Frougier et al. |
| 10,236,362 B2 | 3/2019 | Seo |
| 10,263,100 B1 | 4/2019 | Bi et al. |
| 10,381,462 B2 | 8/2019 | Seo |
| 10,651,291 B2 | 5/2020 | Frougier et al. |

(Continued)

OTHER PUBLICATIONS

International Search Report and Written Opinion dated Sep. 22, 2020 in PCT/US2020/036776, 10 pages.

*Primary Examiner* — Vongsavanh Sengdara
(74) *Attorney, Agent, or Firm* — Oblon, McClelland, Maier & Neustadt, L.L.P.

(57) ABSTRACT

A semiconductor device includes a plurality of nano-channel field-effect transistor stacks positioned adjacent to each other such that source-drain regions are shared between adjacent nano-channel field-effect transistor stacks, each nano-channel field-effect transistor stack including at least two nano-channel field-effect transistors and corresponding source/drain regions vertically separated from each other.

10 Claims, 16 Drawing Sheets

(56) References Cited

U.S. PATENT DOCUMENTS

| | | |
|---|---|---|
| 10,741,456 B2 | 8/2020 | Cheng et al. |
| 10,886,369 B2 | 1/2021 | Zhang et al. |
| 2015/0084133 A1 | 3/2015 | Xiao |
| 2016/0020305 A1 | 1/2016 | Obradovic et al. |
| 2016/0211264 A1 | 7/2016 | Peng |
| 2016/0211276 A1 | 7/2016 | Peng |
| 2016/0307928 A1 | 10/2016 | Liu et al. |
| 2017/0133279 A1 | 5/2017 | Peng |
| 2018/0006139 A1 | 1/2018 | Seo |
| 2018/0097088 A1 | 4/2018 | Seo |
| 2019/0172828 A1 | 6/2019 | Smith et al. |
| 2019/0172829 A1* | 6/2019 | Lee .................. H01L 23/528 |
| 2019/0181224 A1* | 6/2019 | Zhang ............ H01L 29/66553 |
| 2019/0326395 A1 | 10/2019 | Ando et al. |
| 2019/0386113 A1* | 12/2019 | Loubet ............ H01L 29/78696 |
| 2019/0393306 A1 | 12/2019 | Zhang et al. |
| 2021/0335789 A1* | 10/2021 | Zhu .................. G11C 11/4085 |
| 2022/0102559 A1* | 3/2022 | Zhu .................. H01L 29/42392 |
| 2022/0246520 A1* | 8/2022 | Zhu .................. H01L 23/5283 |

\* cited by examiner

MULTIPLE NANO LAYER TRANSISTOR LAYERS WITH DIFFERENT TRANSISTOR ARCHITECTURES FOR IMPROVED CIRCUIT LAYOUT AND PERFORMANCE

CROSS REFERENCE TO RELATED APPLICATIONS

This application is a divisional application of U.S. patent application Ser. No. 16/591,134, filed Oct. 2, 2019, which claims the benefit of and priority to U.S. Provisional Patent Application No. 62/866,975, entitled "MULTIPLE NANO LAYER TRANSISTOR LAYERS WITH DIFFERENT TRANSISTOR ARCHITECTURES FOR IMPROVED CIRCUIT LAYOUT AND PERFORMANCE", filed on Jun. 26, 2019, the entire contents of which are herein incorporated by reference.

BACKGROUND

Technical Field

The present application relates to microelectronic devices, including semiconductor devices, transistors, and integrated circuits. More particularly, it relates to manufacturing of three-dimensional (3D) transistors, including combinations of various field-effect transistors (FETs).

Description of the Related Art

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for 3D semiconductor circuits in which transistors are stacked on top of each other.

Three-dimensional (3D) integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND devices, application to logic designs is substantially more difficult. 3D integration for logic chips (e.g., CPU (central processing unit), GPU (graphics processing unit), FPGA (field programmable gate array), SoC (System on a chip)) is being pursued.

SUMMARY

Techniques herein include 3D architectures and methods of making 3D transistors using multiple selective nano-sheets for fabrication in different device regions (i.e. NMOS, PMOS, and new device types). By optimizing the layout of the nano-sheet planes, more efficient device layout is possible for building different logic circuit combinations and connecting respective transistors and logic elements (e.g. inverter, and other logic elements). Techniques described herein provide an effective solution to make multi-dimensional CMOS (complementary metal-oxide semiconductor) logic circuit elements on multiple transistor planes.

Embodiments include a stack of transistor substrate planes to make a multi-dimensional CMOS logic circuit on multiple transistor planes. Embodiments also enable using transistor stacks as side-by-side building blocks to enable various circuit layouts. Building blocks can be created for various FET combinations for better optimization of FET usage. This provides better usage of W/L layout for NMOS (N-type MOS) and PMOS (P-type MOS). With various vertical stacking options and adjacent placement, a more efficient Idsat (optimum drive current available per area of chip layout) is provided. Transistor architectures herein enable N=1 to N≥10 substrate planes of transistors depending on circuit requirements. An embodiment herein uses a strategic layout of the nano-sheets for PMOS devices and NMOS devices such that a new device called a tunneling field effect transistor (TFET) may be fabricated without any additional process steps using optimum nano-sheet layout. Accordingly, embodiments herein provide 3D circuit designs in advanced circuits as the channel length is further scaled with smaller channel lengths for low voltage/power and low subthreshold slope (SS) requirements.

The order of the different steps as described herein is presented for clarity sake. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the features of the present application can be embodied and viewed in many different ways.

This summary section does not specify every embodiment and/or novel aspect of the present application. Instead, this summary only provides a preliminary discussion of different embodiments and corresponding points of novelty over conventional techniques. Additional details and/or possible perspectives of the disclosed embodiments are described in the Detailed Description section and corresponding Figures of the present disclosure as further discussed below.

BRIEF DESCRIPTION OF THE DRAWINGS

The application will be better understood in light of the description which is given in a non-limiting manner, accompanied by the attached drawings in which.

DETAILED DESCRIPTION OF THE PREFERRED EMBODIMENTS

Reference throughout this specification to "one embodiment" or "an embodiment" means that a particular feature, structure, material, or characteristic described in connection with the embodiment is included in at least one embodiment of the application, but do not denote that they are present in every embodiment.

Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Devices herein are embodied using nano-wires or nano-sheets. The term "nano-channel" herein means either a nano-wire or a nano-sheet shaped channel for a field effect transistor. A nano-wire is a relatively small elongated structure formed having a generally circular cross section or rounded cross section. Nano-wires are often formed from layers that are pattern etched to form a channel having a generally square cross-section, and then corners of this square cross-section structure are rounded, such as by etching, to form a cylindrical structure. A nano-sheet is similar to a nano-wire in that it has a relatively small cross section (less than a micron and typically less than 30 nanometers), but with a cross section that is rectangular. A given nano-sheet can include rounded corners.

During at least one point during the formation or processing of a nano-channel (wire or sheet), the given nano-channel is uncovered on all sides, including a bottom side. This differs from "planar" transistor channels which typically have at least one side that is positioned on bulk silicon (or other material) and that always remains covered (another material in contact with it) during microfabrication. Planar channels enable a gate structure to essentially contact one side or two sides or three sides, but not all sides or surfaces. In contrast, nano-wires and nano-sheets enable gate-all-around (GAA) channels. Thus, a nano-channel herein can have various cross sections, but enables a gate to be formed all around the channel structure.

Figure 1C:
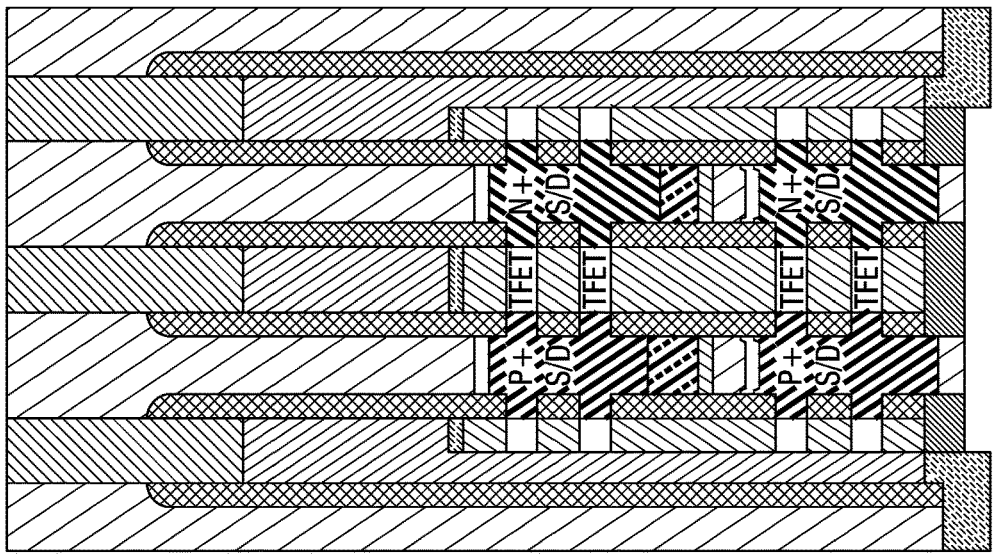
FIGS. 1A-1C show a schematic of three different types of transistor stacks.
Figure 1B:
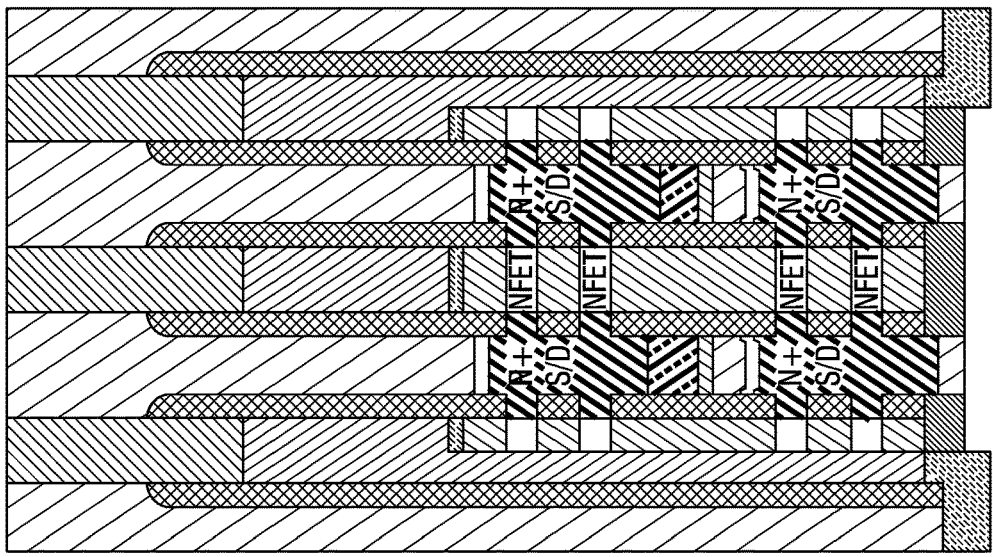
Figure 1A:
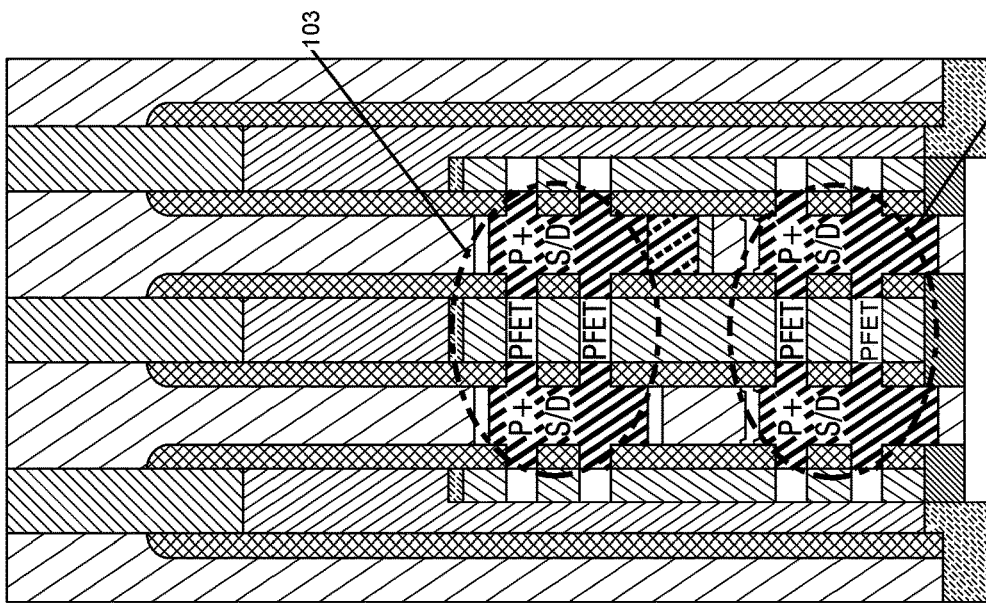

Referring now to FIGS. 1A-1C, three transistor stacks are illustrated. In FIG. 1A, a silicon nano-sheet PFET stack is shown. In FIG. 1B, a silicon nano-sheet NFET stack is shown. And in FIG. 1C, a silicon nano-sheet TFET stack is shown. For the PFET 3D device, on the lower plane 101 there are P+-doped source drain regions connected by a nano-channel thereby forming a P-channel FET. The upper plane 103 also has a P-channel FET, thus there are two PFETs in this FET stack, electrically separated. Note that one or more nano-channels can be used for a given FET. In this particular example, two nano-channels labeled 'PFET" are shown connecting the P+ source/drain regions. More FET devices can be formed in a given stack. For simplicity, the stacks in FIG. 1A show two transistors. Similarly for the NFET 3D device, on the lower plane there are N+-doped source drain regions connected by a nano-channel thereby forming an N-channel FET. Another NFET is formed on the upper plane. For the TFET device, one source/drain is P+-doped, while the source/drain on the opposing side is N+-doped. This configuration forms a TFET device. A second TFET device is formed in the upper plane of the stack.

Figure 4:
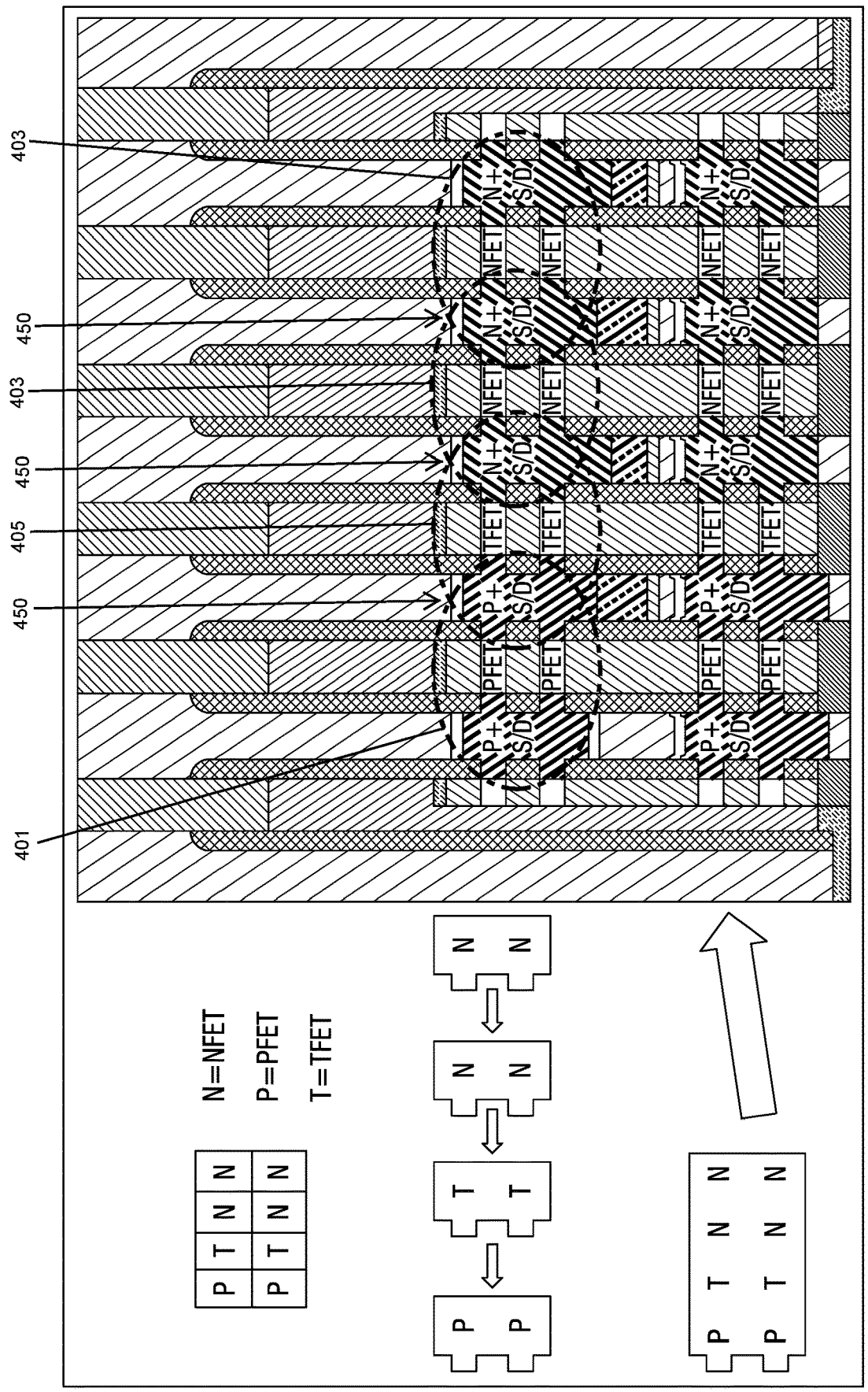
FIG. 4 shows a schematic of different types of transistor stacks connected serially.

As seen in FIG. 4, PFET devices 401 and NFET devices 403 can be formed adjacent to each other, sharing source/drain regions 450 to make TFET devices 405. Likewise, PFET devices can share source/drain regions with adjacent PFET devices. The sharing of source/drain regions enables more transistor stacks per unit area, as well as enabling additional circuit design options with TFET available.

Figure 2:
FIG. 2 shows a schematic of four transistor stacks of TFETs.

In another embodiment, shown in FIG. 2, four transistor stacks of the same type of FET are illustrated. Each of the four transistor stacks comprises a silicon nano-sheet TFET stack. For each of the TFET 3D devices, on the lower plane there are P+-doped source/drain regions and N+ doped source/drain regions connected by a nano-channel thereby forming a TFET. The upper plane also has a TFET, thus there are two TFETs in this TFET stack, electrically separated. Note that one or more nano-channels can be used for a given TFET. In this particular example, two nano-channels are shown connecting the P+ and N+ source/drain regions. More TFET devices can be formed in a given stack. For simplicity, the stacks in FIG. 2 show two transistors. TFET devices can be formed adjacent to each other. In the embodiment shown in FIG. 2, source/drain regions of a first stack of tunneling FET devices are separated from source/drain regions of a second stack of tunneling FET devices.

Figure 3:
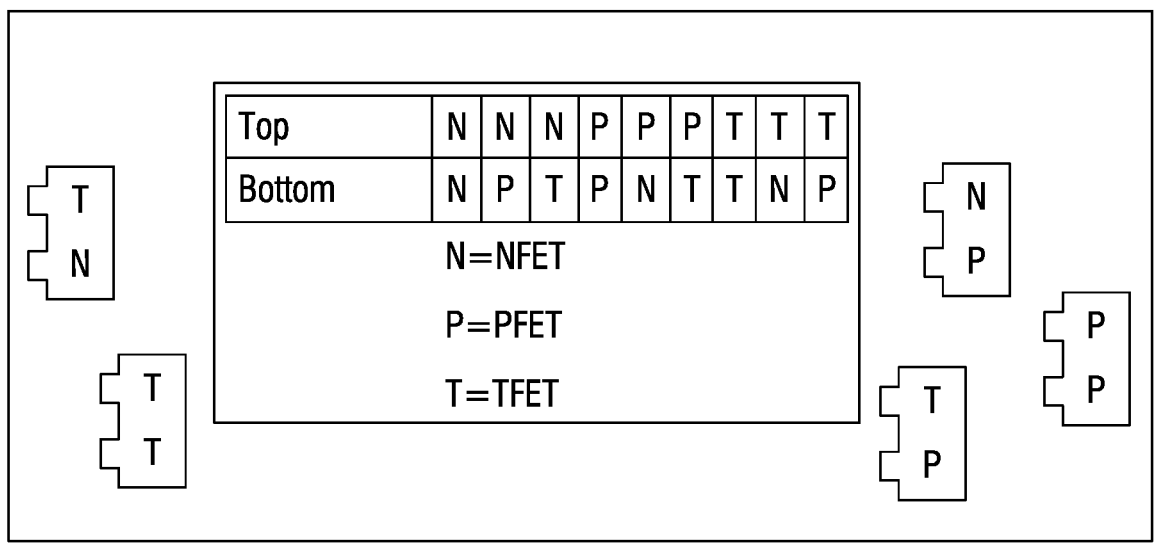
FIG. 3 shows a schematic of different combinations of transistor stacks.

Referring now to FIG. 3, various combinations of device stacks can be selected for a given design. For example, one stack can have NFET on the bottom plane and PFET on the top plane. An adjacent stack can have TFET on the bottom and PFET on the top plane. Accordingly, device stacks of NFET, PFET, and TFET options are available to maximize device design functionality and flexibility.

FIG. 4 illustrates how nano-channel device stacks can be integrated or connected serially. Accordingly, PFET, TFET, or NFET can be formed at selectable locations across a wafer.

Figure 5:
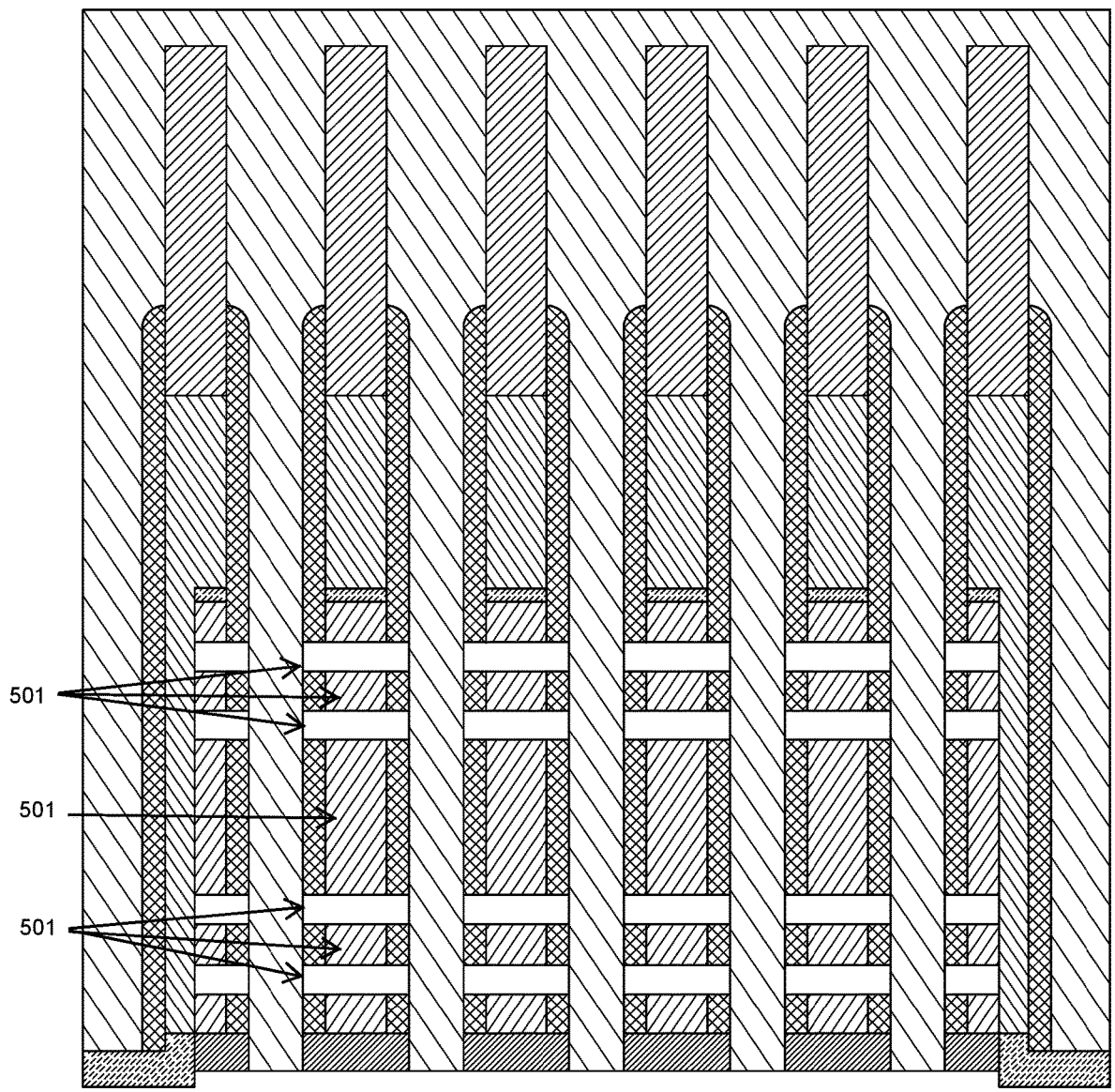
FIGS. 5-16 show different steps in the fabrication of side-by-side stacks of NFET, PFET and TFET devices.

Referring now to FIG. 5, a nano-sheet stack is formed for gate-all-around stacked transistors. This can be, for example for a complementary field-effect transistor (CFET) 3D device. Starting material can be bulk silicon, bulk germanium, silicon on insulator (SOI), or other wafer or substrate. Nano-sheets of multiple layers of material can first be formed as blanket depositions or epitaxial growth. In this example, nine layers of epitaxial growth are used. For example, layers of silicon, silicon germanium, and germanium in various molecular combinations can be grown, $Si(65)Ge(35)/Si_xGe_y/Si/Si_xGe_y/Si/Si_xGe_y/Si/Si_xGe_y/Si$, with typical ranges x from 0.6 to 0.8, and y from 0.4 to 0.2 Then, an etch mask is formed on top of the film stack. The film stack can be anisotropically etched to form nano-sheets 501. Self-aligned double patterning or self-aligned quad patterning can be used to form an etch mask. Buried power rails can be formed. Additional microfabrication steps can include shallow trench isolation (STI) formation, creating dummy gates with poly silicon, selective SiGe release, depositing and etching low-k materials, and sacrificial spacer and inner spacer formation. FIG. 5 shows an example substrate segment after this processing. Also shown is an oxide fill 503 between nano-sheets and/or top tier encapsulation.

Continuing from this nano-sheet stack, trenches are opened at specific locations to form P+-doped or N+-doped source/drain regions at either horizontal or vertical locations.

Figure 6:
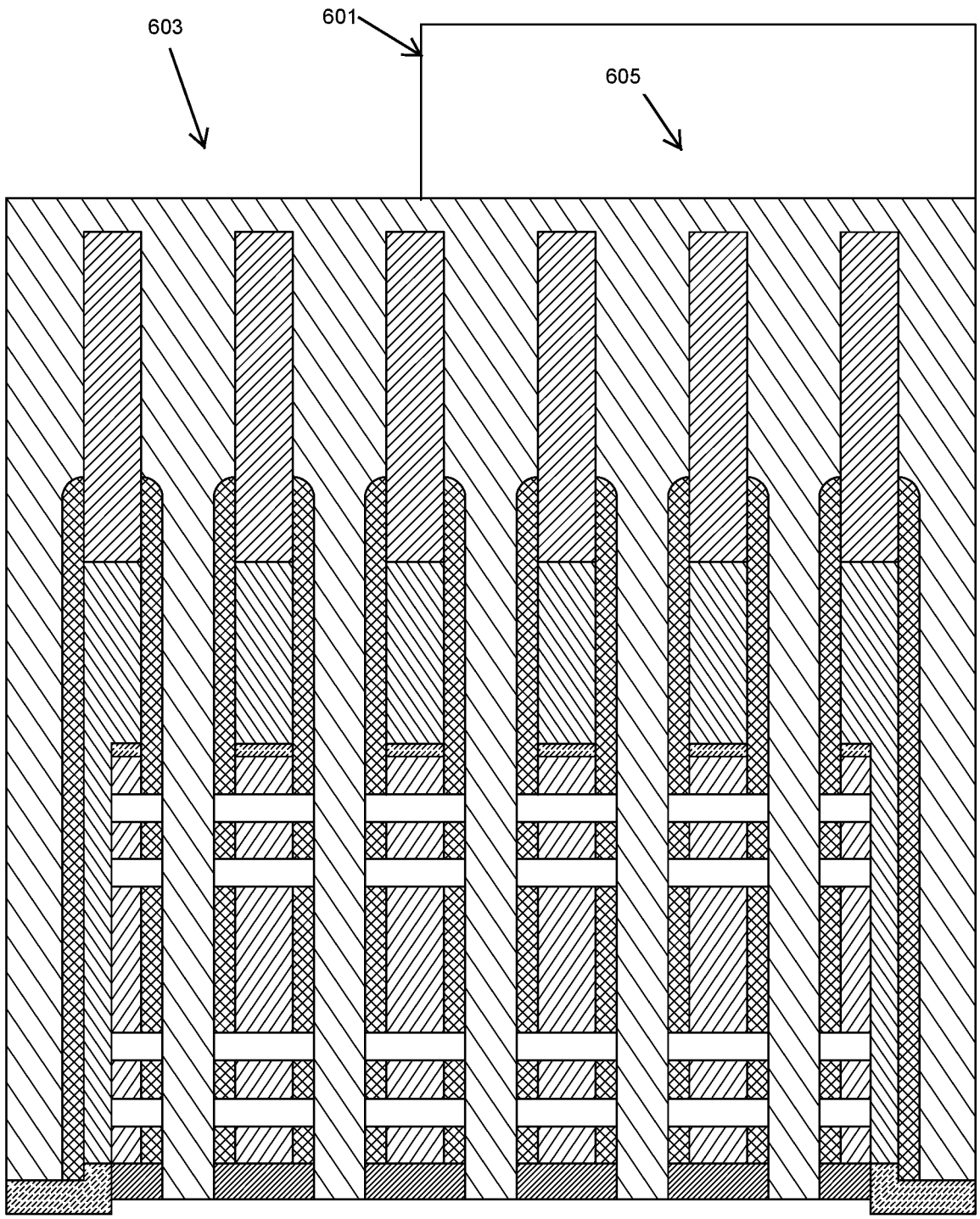

A photomask 601 is formed at specific locations on the substrate to open up P+ source/drain regions 603 only, as illustrated in FIG. 6.

Figure 7:
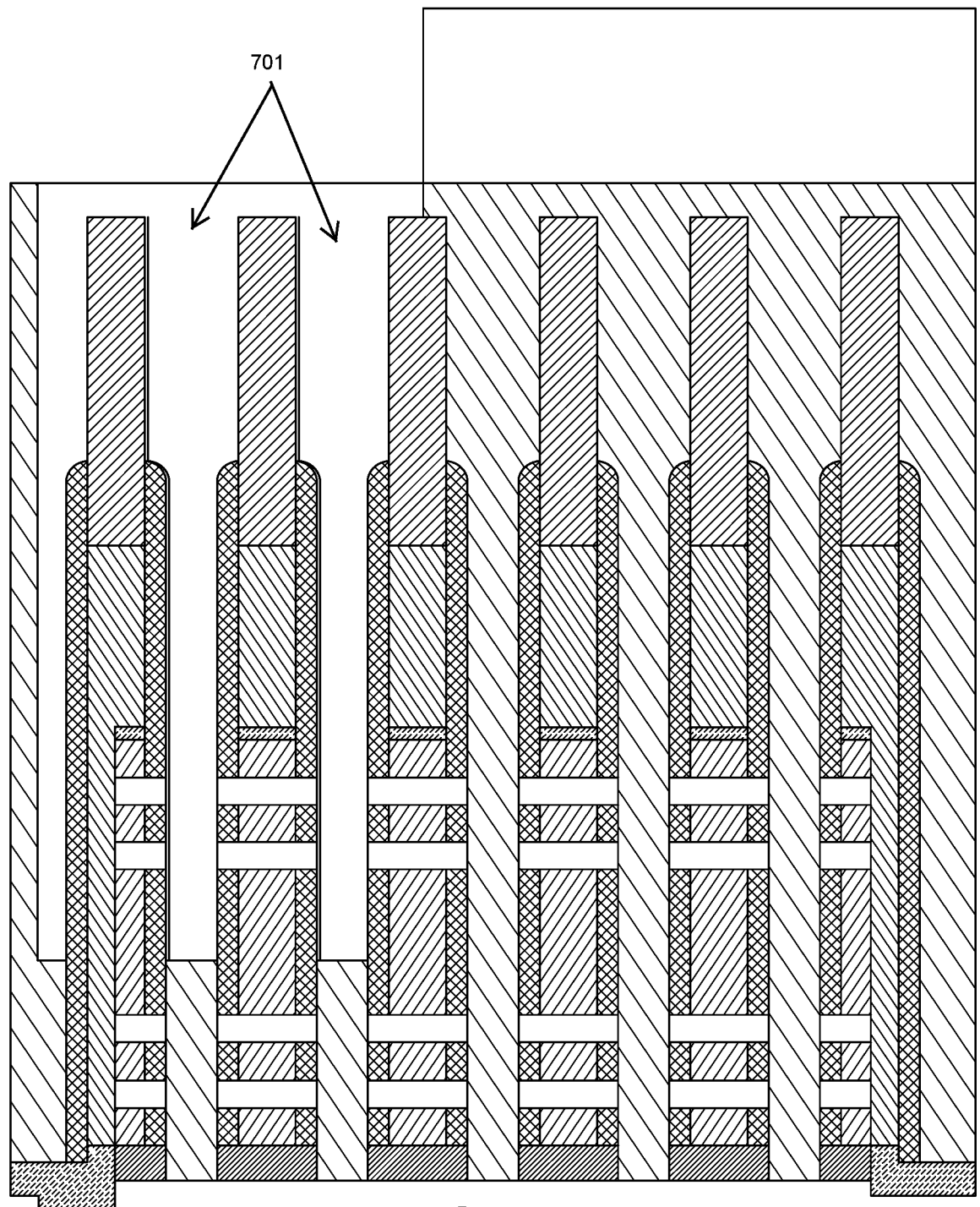

With NMOS regions 605 blocked, the oxide fill (or other fill material) can be removed from in between uncovered nano-sheets 701. Note that the oxide fill can be removed at one or more planes of channels. Note that in this example, with two planes of transistor, the oxide fill is first removed down to a break between the upper transistor plane and the lower transistor plane. An example is shown in FIG. 7. Then, silicon nitride spacers can be formed on sidewalls of the nano-sheets. This can be accomplished by conformal deposition followed by a spacer open etch (directional etch). Thus, the top P+ future source/drain region is covered up to prevent growth in a subsequent step.

Figure 8:
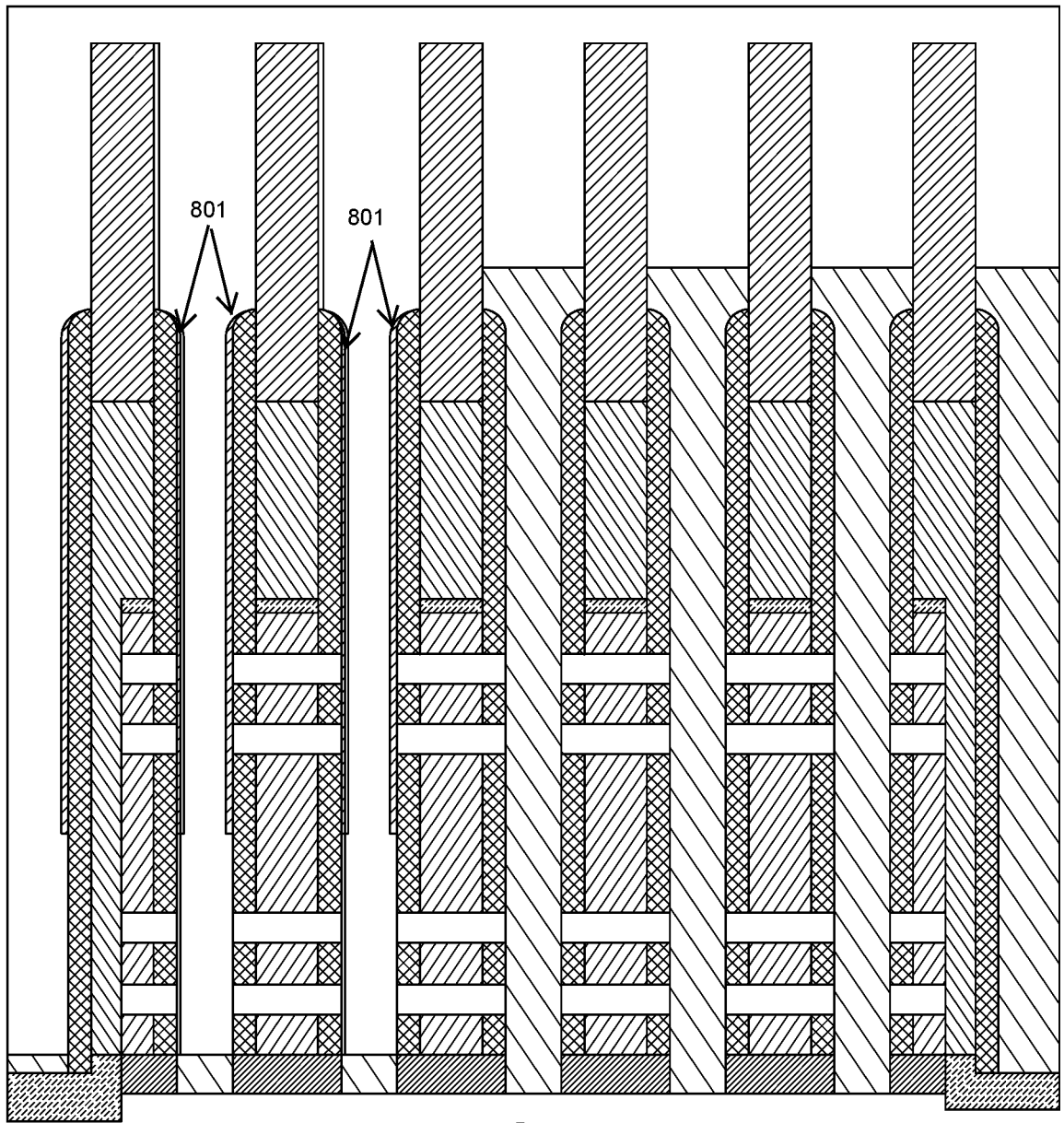

Another anisotropic etch is executed to remove oxide fill from the lower transistor plane, thereby uncovering silicon of the nano-sheet. The photomask can then be removed. FIG. 8 shows an example result including silicon nitride spacers 801.

Figure 9:
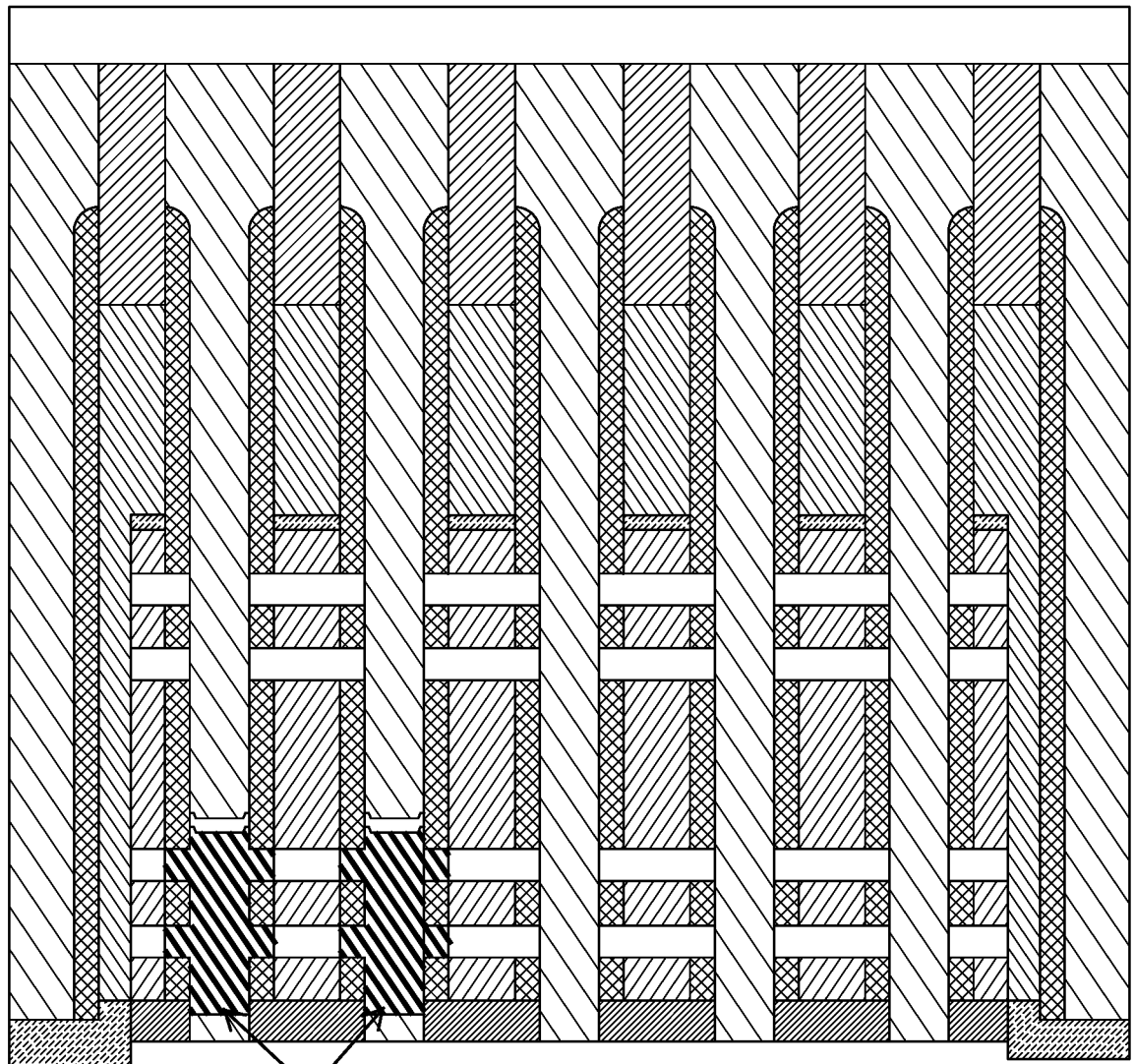

P+-doped SiGe or other material can then be grown in the lower plane source/drain region. After completing epitaxial growth 901, the substrate can be filled with oxide. Any overburden can be removed using chemical-mechanical polishing (CMP) or other planarization techniques. FIG. 9 illustrates an example result of a cross-section of a substrate segment.

Figure 10:
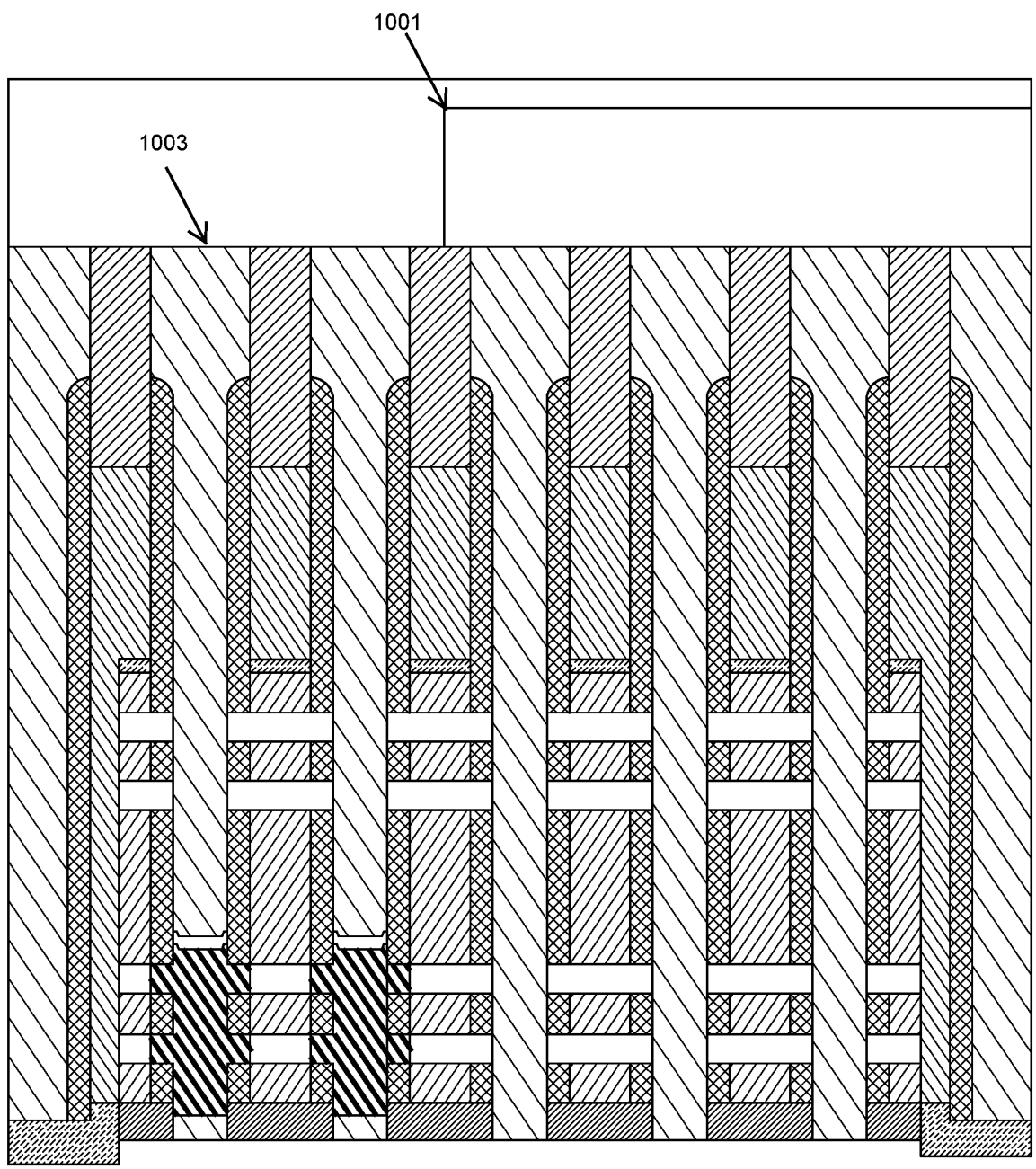

Next, a photomask 1001 is formed again to again cover the NMOS region in this example. FIG. 10 illustrates an example result.

Figure 11:
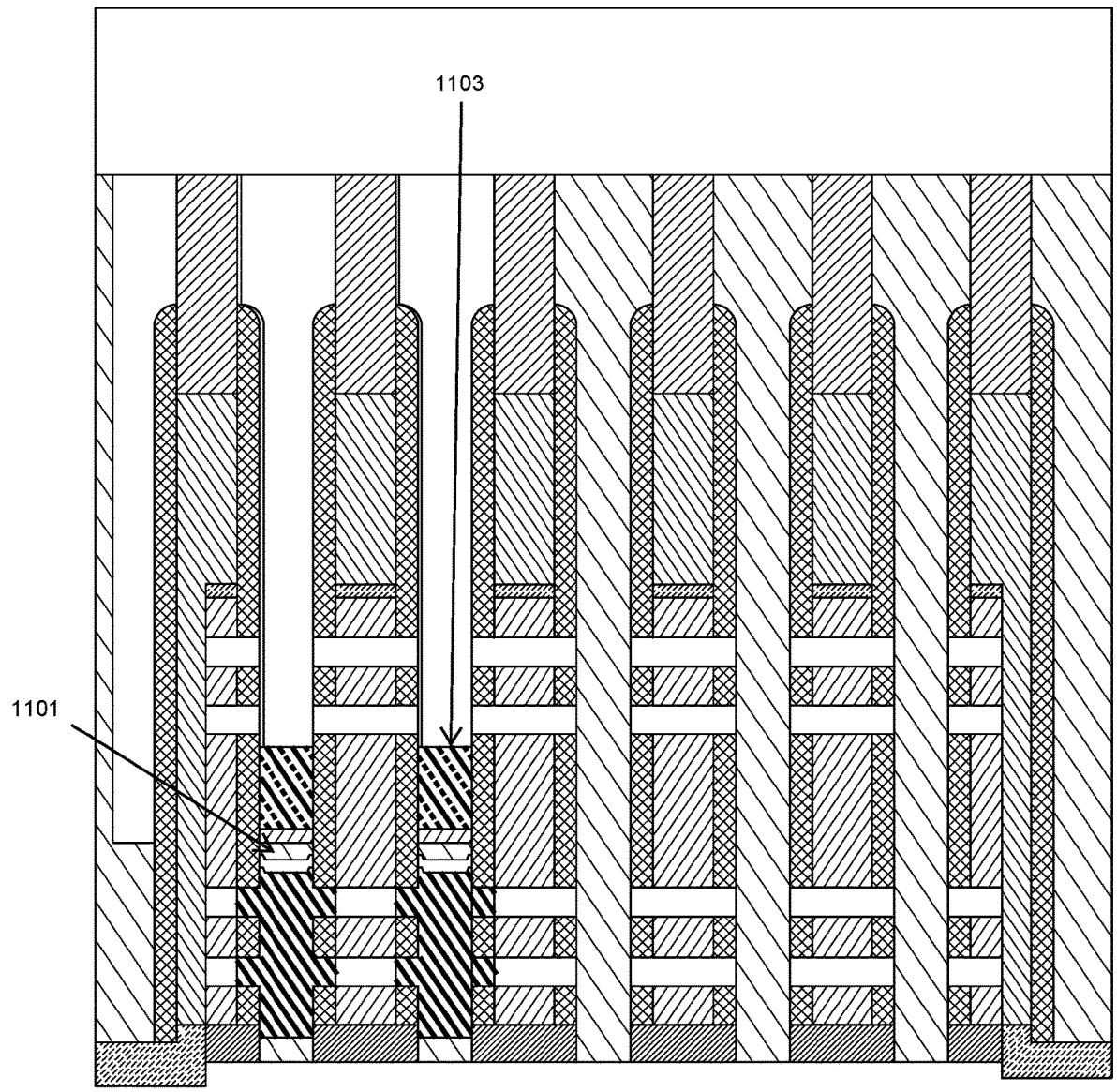

Oxide fill 1003 is removed to uncover the upper transistor plane. Note that oxide fill can be removed down to the source/drain region of the lower transistor plane, with a spacer 1101 then added. Or, oxide fill removal can stop before the source/drain region of the lower transistor plane, to leave a spacer 1101 between the upper and lower source drain regions. After the oxide recess, the silicon nitride sidewalls covering the silicon nano-sheets can be removed. The photomask can also be removed. An example result is illustrated in FIG. 11.

Local interconnects 1103 can also be formed at this point while the bottom source/drain region is uncovered. This can include various deposition, masking, selective removal, and selective deposition steps, such as to form ruthenium contacts or other desired metal.

Figure 12:
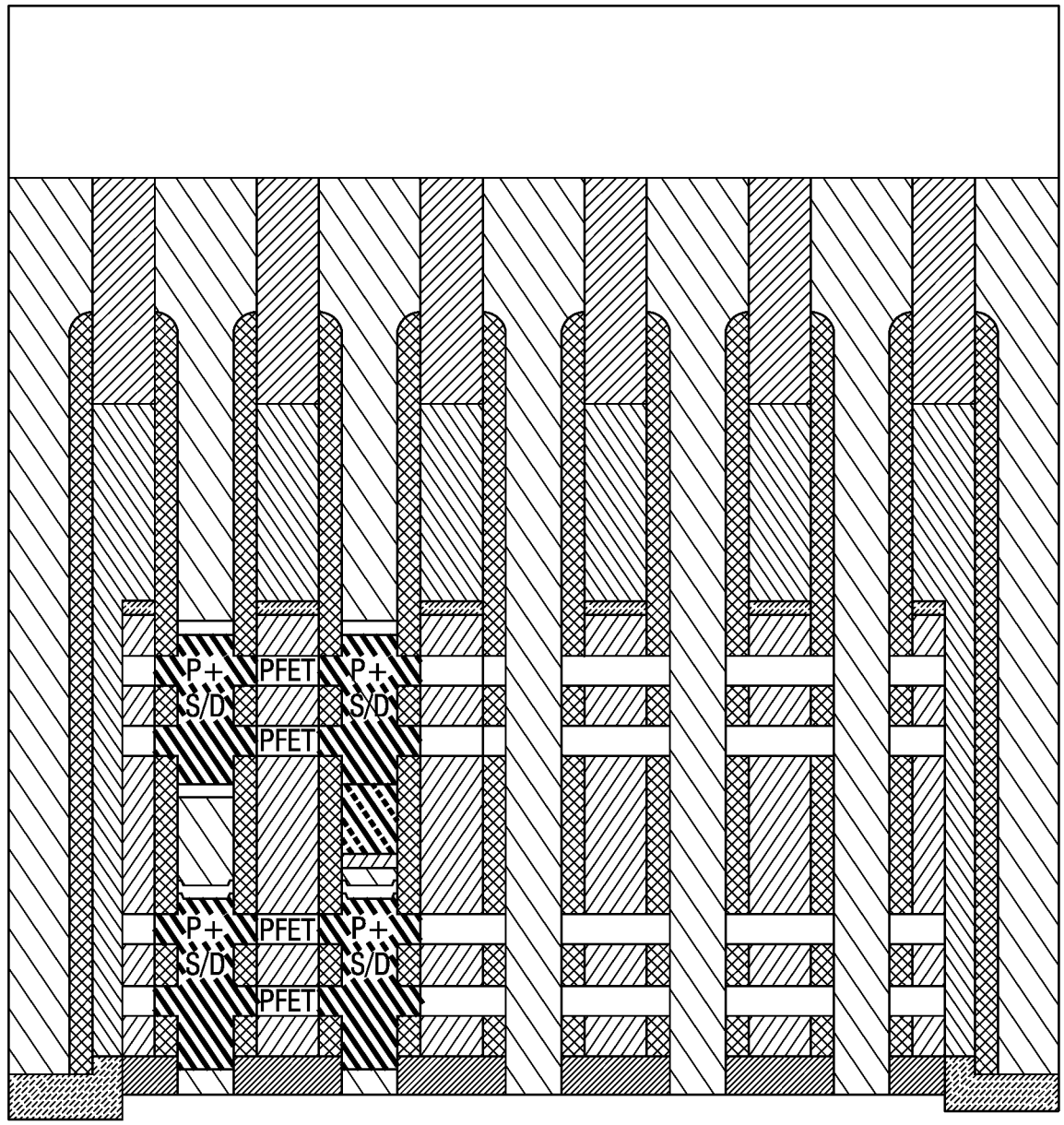

P+-doped source/drain regions can then be grown in uncovered portions of the upper transistor plane. The substrate can then be filled again with oxide and planarized. An example result is illustrated in FIG. 12 with the source/drain regions labeled "P+S/D".

Figure 13:
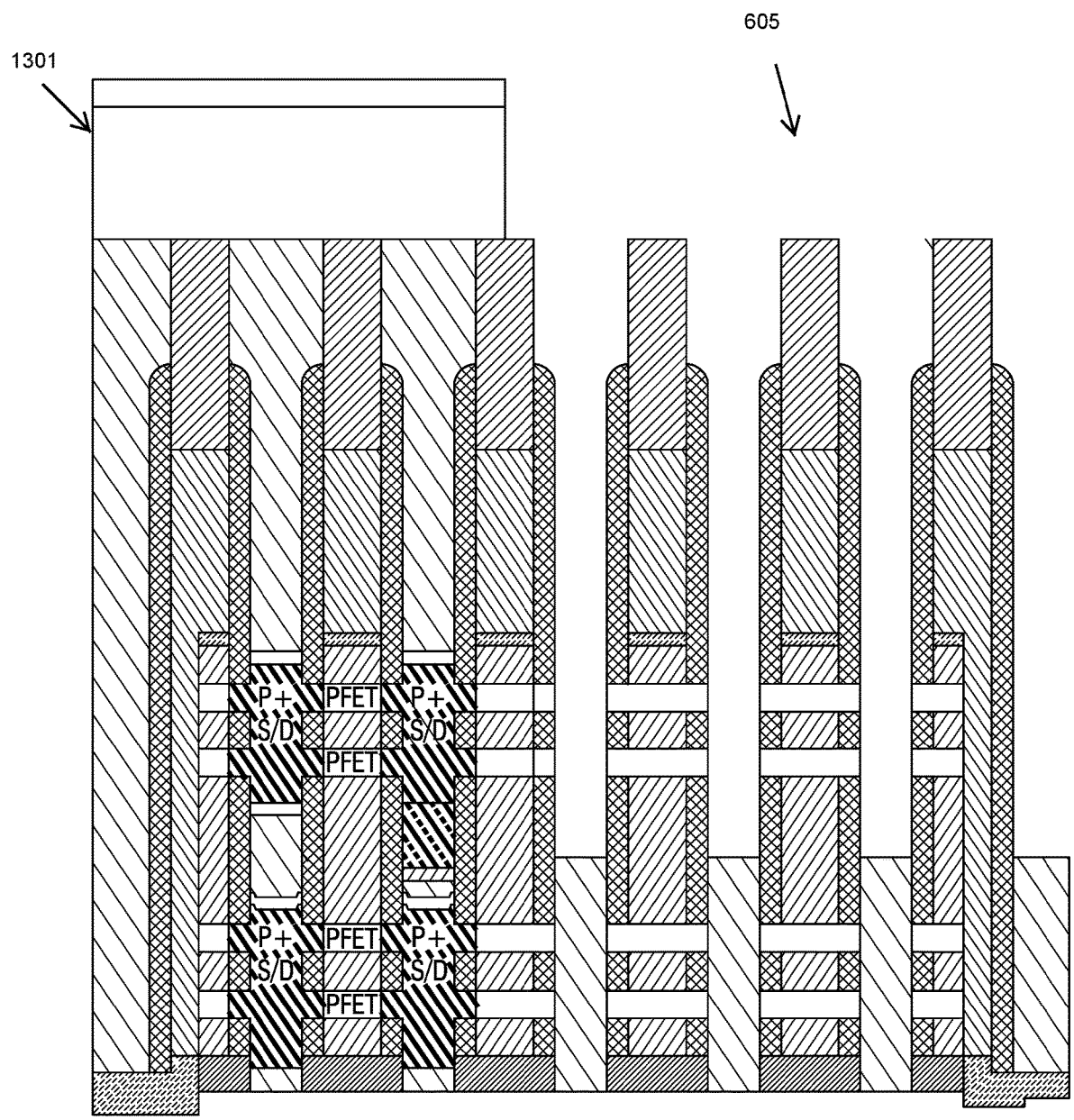

Processing can next continue with N+-doped source/drain formation in NMOS region 605. A third photomask 1301 is added to cover P+-doped (boron) source drain regions on the substrate. The oxide fill is recessed 1303 sufficiently to uncover the upper transistor plane while the lower transistor plane remains covered. An example result is illustrated in FIG. 13.

Figure 14:
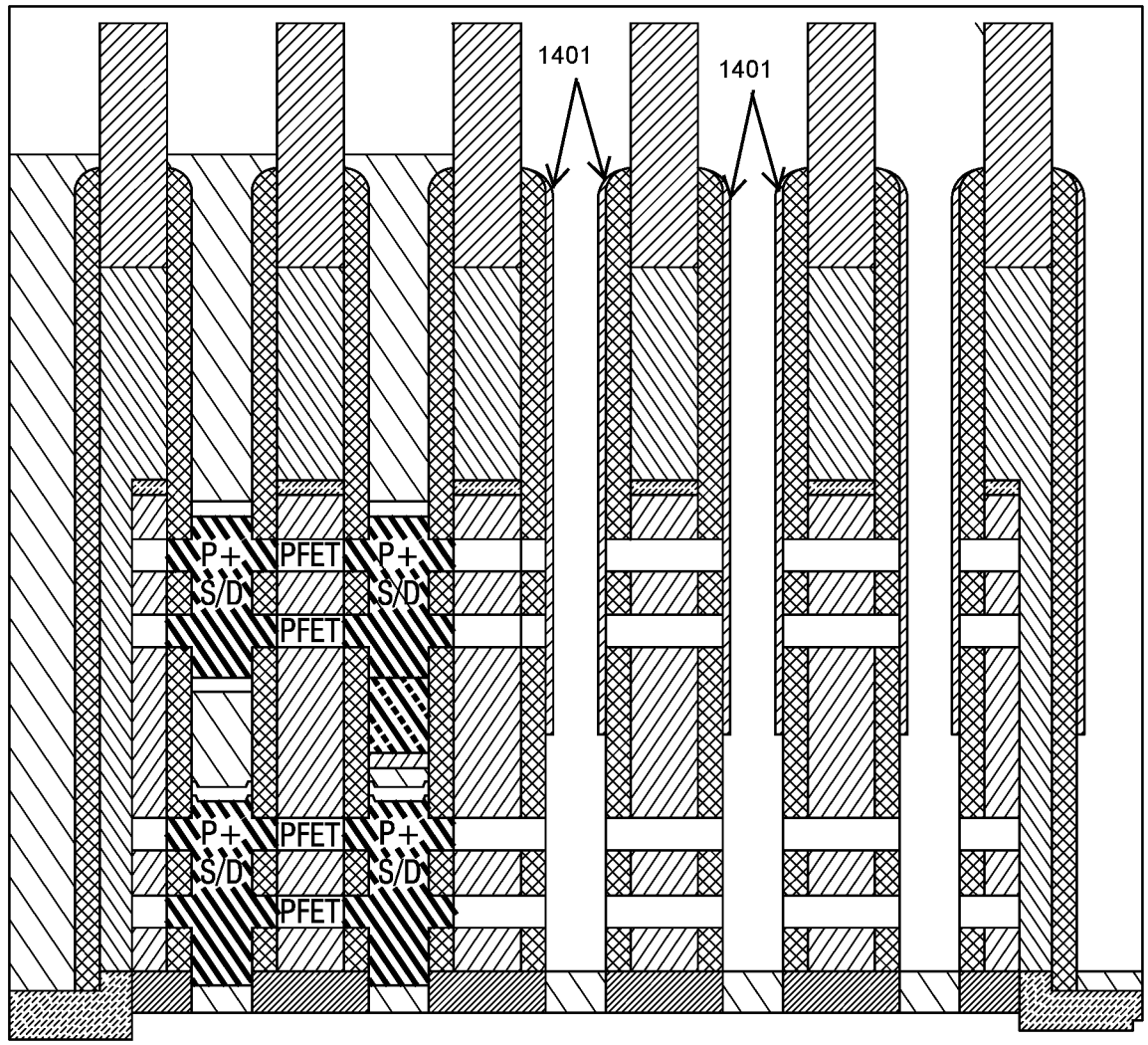

With upper silicon uncovered in the NMOS regions 605, a silicon nitride spacer 1401 can be added to cover silicon sidewalls. Then, the remaining oxide fill can be removed so that silicon from the nano-sheets in the lower transistor plane is uncovered. The third photomask can also be removed. An example result is illustrated in FIG. 14.

Figure 15:
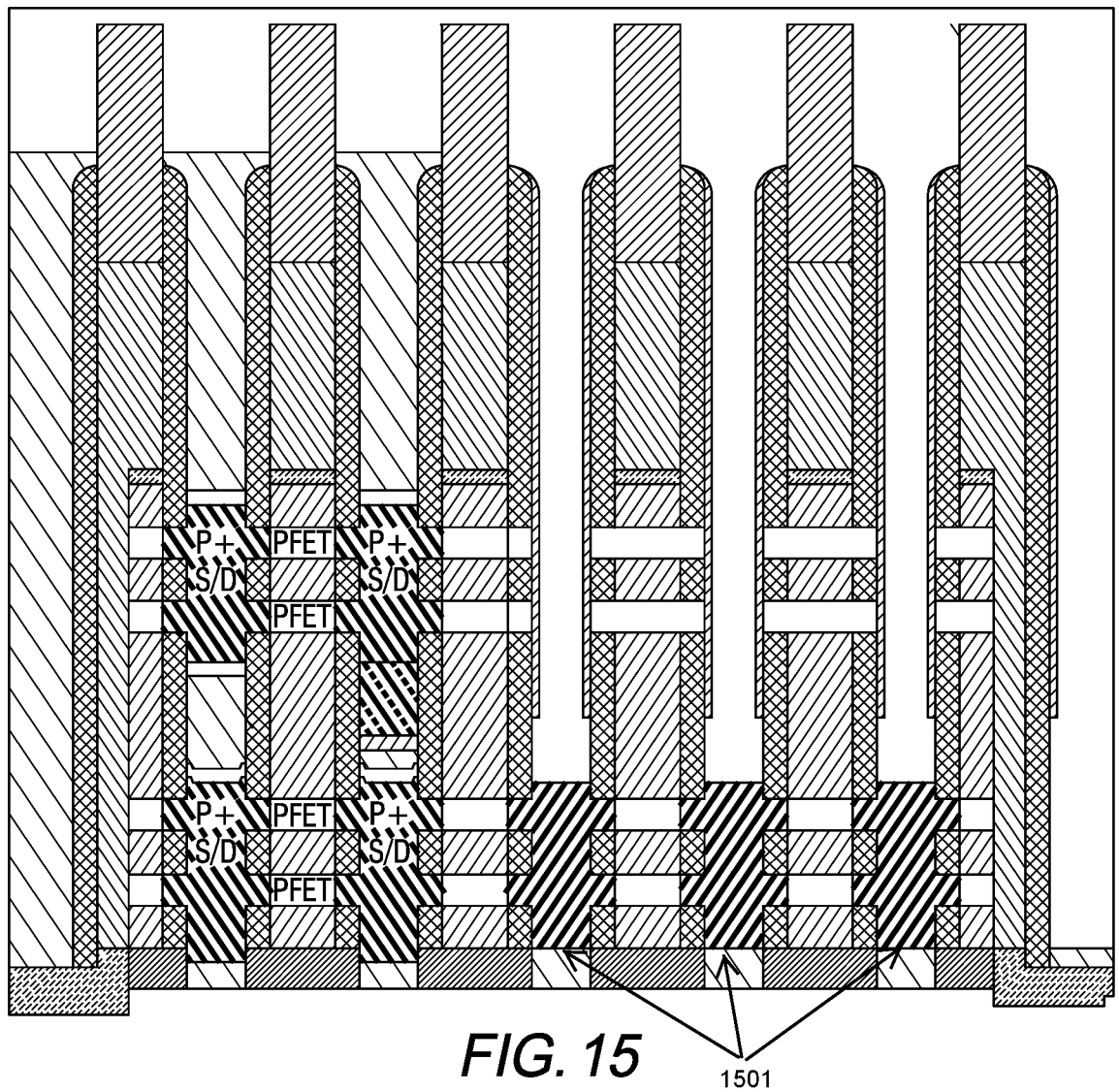

N+-doped material (phosphorus or arsenic) can then be grown in the lower plane source/drain region 1501. After completing epitaxial growth, the substrate can be filled with oxide. Any overburden can be removed using CMP or other planarization techniques. FIG. 15 illustrates an example result of a cross-section of a substrate segment.

Figure 16:
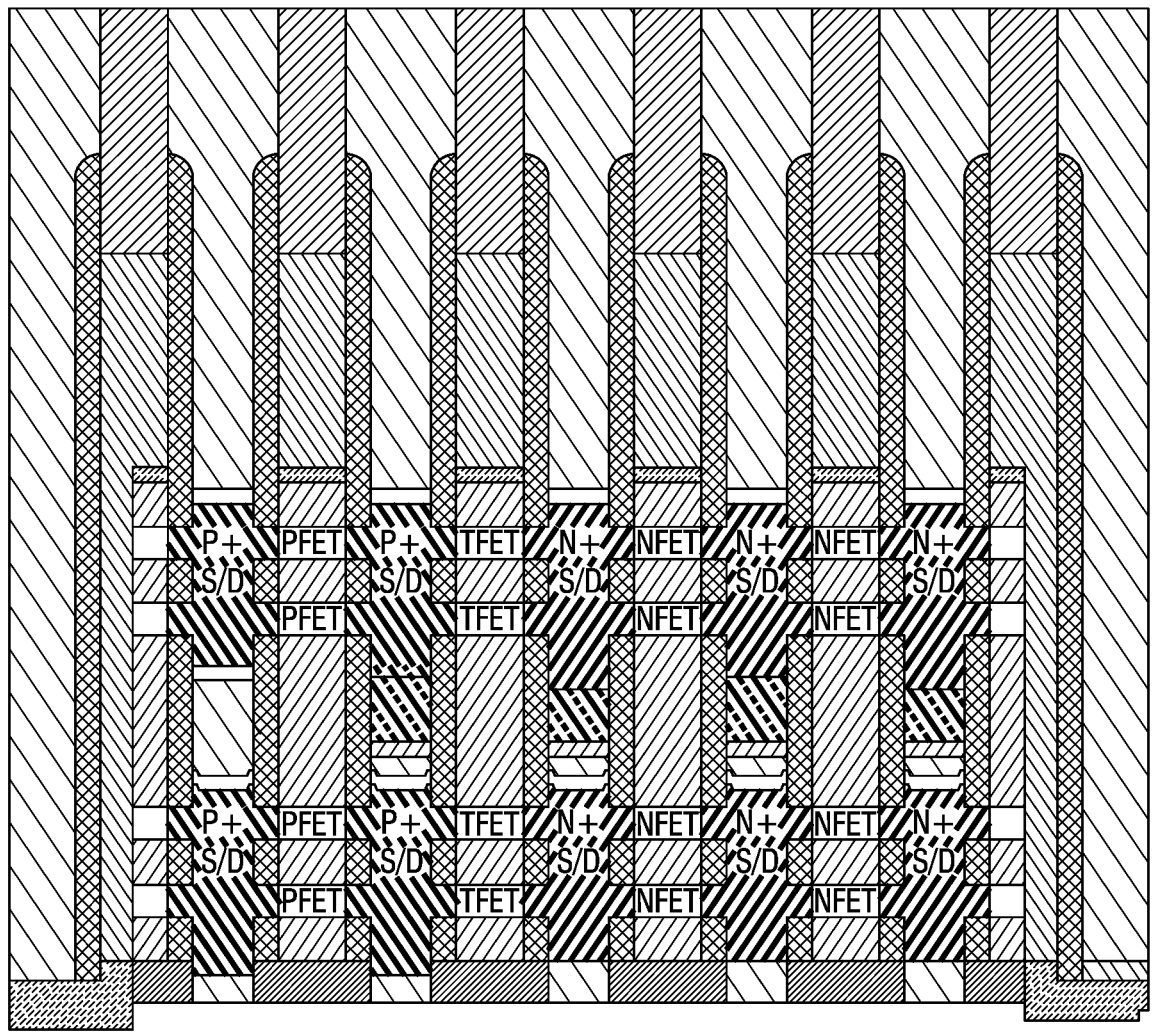

Similar processing as described for the upper P+-doped source/drain region may be used for the upper N+-doped source drain region. Oxide fill may be added to the trenches. An example result is illustrated in FIG. 16 where the device type is noted by "PFET", "TFET" or "NFET" labeling in channel regions of the device. As noted in the description of FIGS. 4 and 9, epitaxial growths 1601 serve as shared source/drain regions for adjacent FETs within a plane. From this point, additional processing can be continued. For example, local interconnect steps can be completed as well as further wiring. Dummy poly gate material can be removed. Replacement metal gate for all transistors can be completed. This can include removing oxide, SiGe channel release, silicon etch trim, depositing interfacial SiO, depositing high-K material, depositing any of TiN, TaN, TiAl, or other desired work function metals. Replacement metal gate for PMOS device can include depositing organic planarization layer and recessing selected portions of the planarization layer, and removing TiAL.

Note that N+-doped and P+-doped source/drain regions can be interchanged at any level (vertical level) by changing the masking epi growth. Moreover, N+-doped and P+-doped source/drain regions can be interchanged at any horizontal coordinate location on the substrate. In this way, an array of different types of FETs can be implemented (for example, the configuration shown in FIG. 15 (extending in one dimension) extending in two dimensions). In other embodiments, different types of materials—and different doping levels—can be executed for S/D epi on different transistor planes.

Accordingly, side-by-side NFETs or PFETs or TFETs can be created with any number of FETs as needed for circuit elements. Symmetrical source/drain CMOS devices can be integrated with asymmetrical S/D TFET CMOS within a same process. Techniques herein enable flexible positioning of NMOS and PMOS devices to be integrated more efficiently for circuit design layout by having separate stacks for NMOS and PMOS devices in close proximity to each other. Methods herein provide flexibility to fabricate one nano-plane to more than ten nano-planes depending on circuit requirements or design objectives.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The invention claimed is:

1. A method of forming a semiconductor device, the method comprising:

forming nano-sheet structures each having stacked layers of different materials including at least two layers of channel material suitable for use as a channel of a field-effect transistor (FET);

selectively masking a second portion of the nano-sheet structures while leaving a first portion including a first nano-sheet structure unmasked;

forming a first doped source/drain region in uncovered openings at a first layer of channel material in the first nano-sheet structure while a second layer of channel material in the first nano-sheet structure is covered, and forming a second doped source/drain region in the uncovered openings at the second layer of channel material in the first nano-sheet structure, the second doped source/drain region positioned vertically above the first doped source/drain region;

selectively masking the first portion of the nano-sheet structures while leaving the second portion including a second nano-sheet structure unmasked:

forming a third doped source/drain region in uncovered openings at a first layer of channel material in the second nano-sheet structure while a second layer of channel material in the second nano-sheet structure is covered, and forming a fourth doped source/drain region in the uncovered openings at the second layer of channel material in the first nano-sheet structure, the fourth doped source/drain region positioned vertically above the third doped source/drain region, wherein the first doped source/drain region shares the first channel with the third source/drain region, and wherein the second doped source/drain region shares the second channel with the fourth source/drain region.

2. The method of claim 1, further comprising using selected dopants to form a tunneling FET between the first doped source/drain region and the third doped source drain region.

3. The method of claim 1, further comprising using selected dopants to form a tunneling FET between the second doped source/drain region and the fourth doped source drain region.

4. The method of claim 1, further comprising selectively forming stacked nano-channel field-effect transistors adjacent to each other, each stacked nano-channel field effect transistor having at least two FETs positioned in a vertical stack, wherein each given source/drain region is selectively doped with either p-type dopants or re-type dopants to result in combinations of adjacent p-channel FET devices, n-channel FET devices, and tunneling FET devices at each plane of the nano-sheet structures.

5. The method of claim 4, wherein a p-channel FET device is formed adjacent to a tunneling FET device, the tunneling FET device being formed adjacent to an n-channel FET device, at a plane of the nano-sheet structures.

6. The method of claim 4, wherein the p-type dopant is boron and the n-type dopant is phosphorus or arsenic.

7. The method of claim 4, wherein n-type doped and p-type-doped source/drain regions are interchanged at any horizontal coordinate location on the substrate, thus resulting in arrays of different types of FETs.

8. The method of claim 1, wherein the number of nano-sheet structures in a stack of nano-sheet structures formed on the substrate is in the range of one to ten.

9. The method of claim 1, wherein the forming of each of the first, second, third and fourth doped source/drain regions comprises epitaxially growing a source/drain region.

10. The method of claim 1, wherein at least one of the first, second, third and fourth doped source/drain regions is formed as a common source/drain region with an adjacent device.

* * * * *

UNITED STATES PATENT AND TRADEMARK OFFICE
CERTIFICATE OF CORRECTION

PATENT NO. : 11,894,378 B2
APPLICATION NO. : 17/727249
DATED : February 6, 2024
INVENTOR(S) : Fulford et al.

It is certified that error appears in the above-identified patent and that said Letters Patent is hereby corrected as shown below:

In the Claims

In Column 7, Claim 1, Line 25, delete "unmasked:" and insert -- unmasked; --, therefor.

In Column 8, Claim 4, Line 13, delete "re-type" and insert -- n-type --, therefor.

In Column 8, Claim 7, Line 23, after "wherein" insert -- the --.

In Column 8, Claim 10, Line 33, after "wherein" insert -- the --.

Signed and Sealed this
Sixteenth Day of July, 2024

Katherine Kelly Vidal
*Director of the United States Patent and Trademark Office*